United States Patent
Lee et al.

(10) Patent No.: US 7,221,170 B2
(45) Date of Patent: May 22, 2007

(54) SEMICONDUCTOR TEST CIRCUIT

(75) Inventors: Hong-jun Lee, Suwon (KR); Yong-gyu Chu, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/344,845

(22) Filed: Feb. 1, 2006

(65) Prior Publication Data

US 2006/0170433 A1    Aug. 3, 2006

(30) Foreign Application Priority Data

Feb. 1, 2005    (KR) ...................... 10-2005-0009104

(51) Int. Cl.
G01R 27/08    (2006.01)
(52) U.S. Cl. ................. 324/713; 324/765; 702/117
(58) Field of Classification Search ............... None
See application file for complete search history.

(56) References Cited

U.S. PATENT DOCUMENTS

| | | | |
|---|---|---|---|
| 5,786,524 A | 7/1998 | Powell et al. ............... 568/862 |
| 6,549,480 B2 | 4/2003 | Hosogane et al. .......... 365/226 |
| 2003/0065994 A1* | 4/2003 | Kang et al. ................. 714/708 |

FOREIGN PATENT DOCUMENTS

| | | |
|---|---|---|
| JP | 2002-074996 | 3/2002 |
| KR | 10-0292702 | 6/2001 |
| WO | 94/22563 | 10/1994 |
| WO | 2004/031108 A1 | 4/2004 |

\* cited by examiner

Primary Examiner—Vincent Q. Nguyen
(74) Attorney, Agent, or Firm—Mills & Onello LLP

(57) ABSTRACT

A semiconductor test circuit is installed inside a semiconductor device to measure the state of at least one electrical signal of the semiconductor device, and includes first, second, and Nth signal selecting units (where N is an integer greater than 2). The first signal selecting unit either outputs a first electrical signal received from a first terminal or provides a high impedance state to a pad connected to a second terminal in response to a first control signal. The second signal selecting unit either outputs a second electrical signal received from a first terminal or provides a high impedance state to the pad connected to a second terminal in response to a second control signal. The Nth signal selecting unit either outputs an Nth electrical signal (N is an integer) received from a first terminal or provides a high impedance state to the pad connected to the second terminal in response to an Nth control signal.

9 Claims, 4 Drawing Sheets

SEMICONDUCTOR TEST CIRCUIT

BACKGROUND OF THE INVENTION

This application claims the priority of Korean Patent Application No. 10-2005-0009104, filed on Feb. 1, 2005 in the Korean Intellectual Property Office, the disclosure of which is incorporated herein in its entirety by reference.

1. Field of the Invention

The present invention relates to a semiconductor device, and more particularly, to a semiconductor test circuit capable of measuring a plurality of internal DC voltages when the semiconductor device is in a packaged state.

2. Description of the Related Art

When a certain section of a circuit to be configured in a semiconductor device or the state of a predetermined DC voltage line used in the semiconductor device is to be tested or inspected, a probe head is made to contact a node or the DC voltage line of a wafer being manufactured to measure the voltage value of the node or the DC voltage line. However, the voltages and currents measured when the devices are in the wafer state do not necessarily match the voltages and currents measured when the devices are in a packaged state. Therefore, measurement of the voltage or current of a predetermined node or a metal line of a semiconductor device when the device is in the packaged state, in which the assembly process of the semiconductor device has been completed, has greater significance.

In order to measure the voltage or current of a node or a DC voltage line when a semiconductor is in a packaged state, package pins connected to the node or the DC voltage line need to be allocated for testing the same. However, the package pins used for testing are useless in performing actual functions during actual operation of a semiconductor device. Therefore, is beneficial to minimize the number package pins that are consumed for testing operations.

In a semiconductor memory device, the voltage level of an internal DC voltage generated using the power voltage input from an external source is an important factor in determining the operating characteristics of the semiconductor memory device. Thus, numerous test circuits are often times installed in a packaged semiconductor to measure the level of the internal DC voltage.

FIG. 1A is a block diagram a conventional semiconductor test circuit for measuring four internal DC voltages V1 through V4 using a single package pin pad PAD. FIG. 1B is a schematic diagram of a circuit that generates control signals CON1, CON2, CON1B, and CON2B used in the semiconductor test circuit illustrated in FIG. 1A.

Referring to FIG. 1A, the semiconductor test circuit is installed in a semiconductor device, and connection relationships of six areas A1 through A6 of the device illustrated with dotted circles are to be monitored during the manufacturing process. For example, when the area A1 and the area A5 are connected, a voltage value of a first electrical signal V1 can be measured using the pad PAD in response to a first control signal CON1 and CON1B. The pad PAD is electrically connected to a package pin, and thus the value of an internal electrical signal V1 of a chip can be monitored when the chip is in a packaged state. However, the conventional semiconductor test circuit illustrated in FIG. 1A cannot select another electrical signal for testing, for example V2, V3, or V4, once the assembly process is completed, because the electrical signal to be tested is determined during the manufacturing process.

In addition, referring to FIG. 1B, a pull-up voltage $V_{pu}$ applied to gates of transistors M1 and M2 for pulling up a control signal transmits a predetermined stable voltage following a predetermined time period when power is supplied to the semiconductor device. As a result, a delay time is required for proper measurement of the electrical signal, thereby increasing the time required for testing the semiconductor device.

SUMMARY OF THE INVENTION

The present invention provides a semiconductor test circuit that does not require a predetermined delay time for proper measurement of a signal level of an electrical signal and is capable of selecting an electrical signal to be tested, even after assembly of a semiconductor device has been completed.

According to an aspect of the present invention, there is provided a semiconductor test circuit installed in a semiconductor device to measure a state of at least one electrical signal of the semiconductor device. The semiconductor test circuit includes: first through Nth signal selecting units (N is an integer greater than two). The first signal selecting unit either outputs a first electrical signal received from a first terminal or provides a high impedance state to a pad connected to a second terminal in response to a first control signal. The second signal selecting unit either outputs a second electrical signal received from a first terminal or provides a high impedance state to the pad connected to a second terminal in response to a second control signal. The Nth signal selecting unit either outputs an Nth electrical signal (N is an integer greater than two) received from a first terminal or provides a high impedance state to the pad connected to the second terminal in response to an Nth control signal.\

In one embodiment, when one of the N control signals which control the N signal selecting units is enabled, a remainder of the N control signals are disabled.

In another embodiment, the semiconductor test circuit further comprises a control signal generating unit that generates the N control signals in response to a test enable signal.

In another embodiment, the first signal selecting unit comprises a first operational amplifier in which the first electrical signal is input to a first input terminal and a second input terminal is connected to an output terminal, and either outputs the first electrical signal when activated or provides a high impedance state when not activated in response to the first control signal; the second signal selecting unit comprises a second operational amplifier in which the second electrical signal is input to a first input terminal and a second input terminal is connected to an output terminal, and either outputs the second electrical signal when activated or outputs a high impedance state when not activated in response to the second control signal; and the Nth signal selecting unit comprises an Nth operational amplifier in which the Nth electrical signal is input to a first input terminal and a second input terminal is connected to an output terminal, and either outputs the Nth electrical signal when activated or outputs a high impedance state when not activated in response to the Nth control signal.

In another embodiment, the first signal selecting unit comprises: a first resistor; a second resistor in which a first terminal is connected to a first terminal of the first resistor and a second terminal is connected to a power voltage; and a first operational amplifier in which the first electrical signal is input to a first input terminal and a second input terminal is connected to a common terminal of the first and second resistors, and an output terminal of the first operational amplifier is connected to a second terminal of the first resistor and operates in response to the first control signal; the second signal selecting unit comprises: a third resistor; a fourth resistor in which a first terminal is connected to a first terminal of the third resistor and a second terminal is connected to a power voltage; and a second operational amplifier in which the second electrical signal is input to a first input terminal and a second input terminal is connected to a common terminal of the third and fourth resistors, and an output terminal of the second operational amplifier is connected to the second terminal of the third resistor and operates in response to the second control signal; and the Nth signal selecting unit comprises: a fifth resistor; a sixth resistor in which a first terminal is connected to a first terminal of the fifth resistor and a second terminal is connected to a power voltage; and an Nth operational amplifier in which the Nth electrical signal is input to a first input terminal and a second input terminal is connected to a common terminal of the fifth and sixth resistors, and an output terminal of the Nth operational amplifier is connected to the second terminal of the fifth resistor and operates in response to the Nth control signal.

In another embodiment, the N signal selecting units each comprise one of a first selection unit and a second selection unit, wherein each of the first selection units includes an operational amplifier in which one of the N electrical signals is input to a first input terminal and a second input terminal is connected to an output terminal, and either outputs the electrical signal when activated or outputs a high impedance state when not activated in response to a corresponding control signal among the N control signals; and wherein each of the second selection units comprises: a first resistor; a second resistor in which a first terminal is connected to a first terminal of the first resistor and a second terminal is connected to a power voltage; and an operational amplifier in which one of the N electrical signals is input to a first input terminal, a second input terminal is connected to a common terminal of the first and second resistors, and an output terminal is connected to the second terminal of the first resistor, and operates in response to a corresponding control signal among the N control signals.

In another embodiment, the first, second, and Nth electrical signals are one of DC voltages used in the semiconductor device.

In another embodiment, the semiconductor device is mounted in a package.

In another embodiment, the pad is bonded to a pin of the package.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
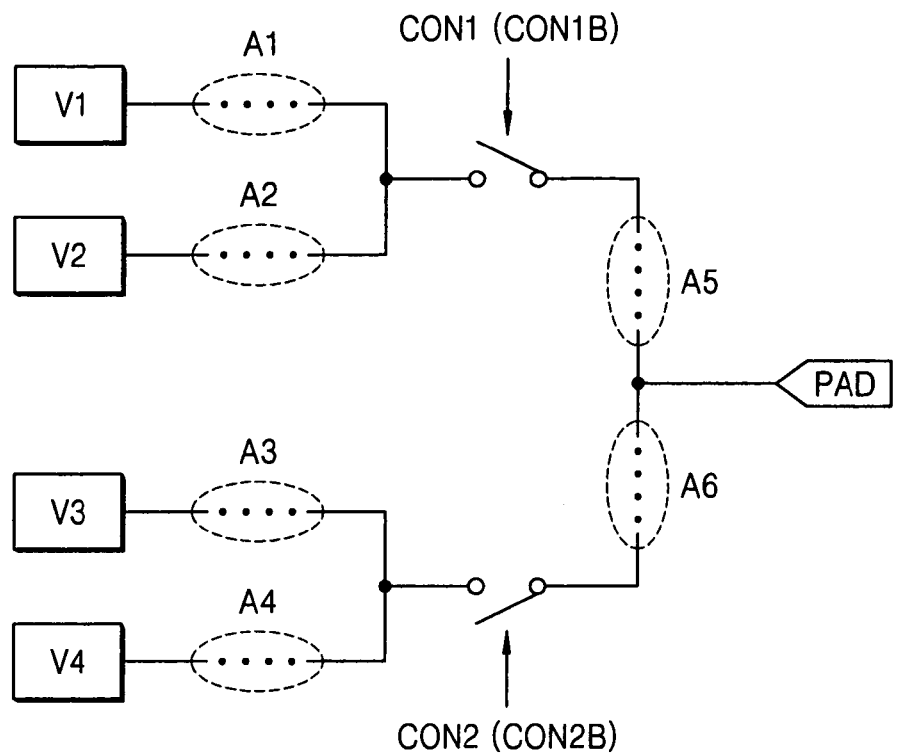
FIG. 1A is a block diagram of a conventional semiconductor test circuit for measuring four internal DC voltages using a single pad.
Figure 1B:
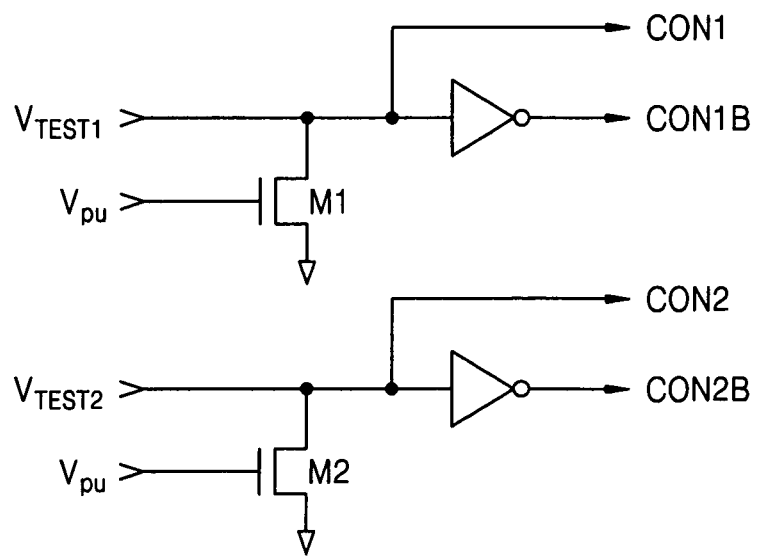
FIG. 1B is a schematic diagram of a circuit which generates control signals used in the semiconductor test circuit illustrated in FIG. 1A.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 2:
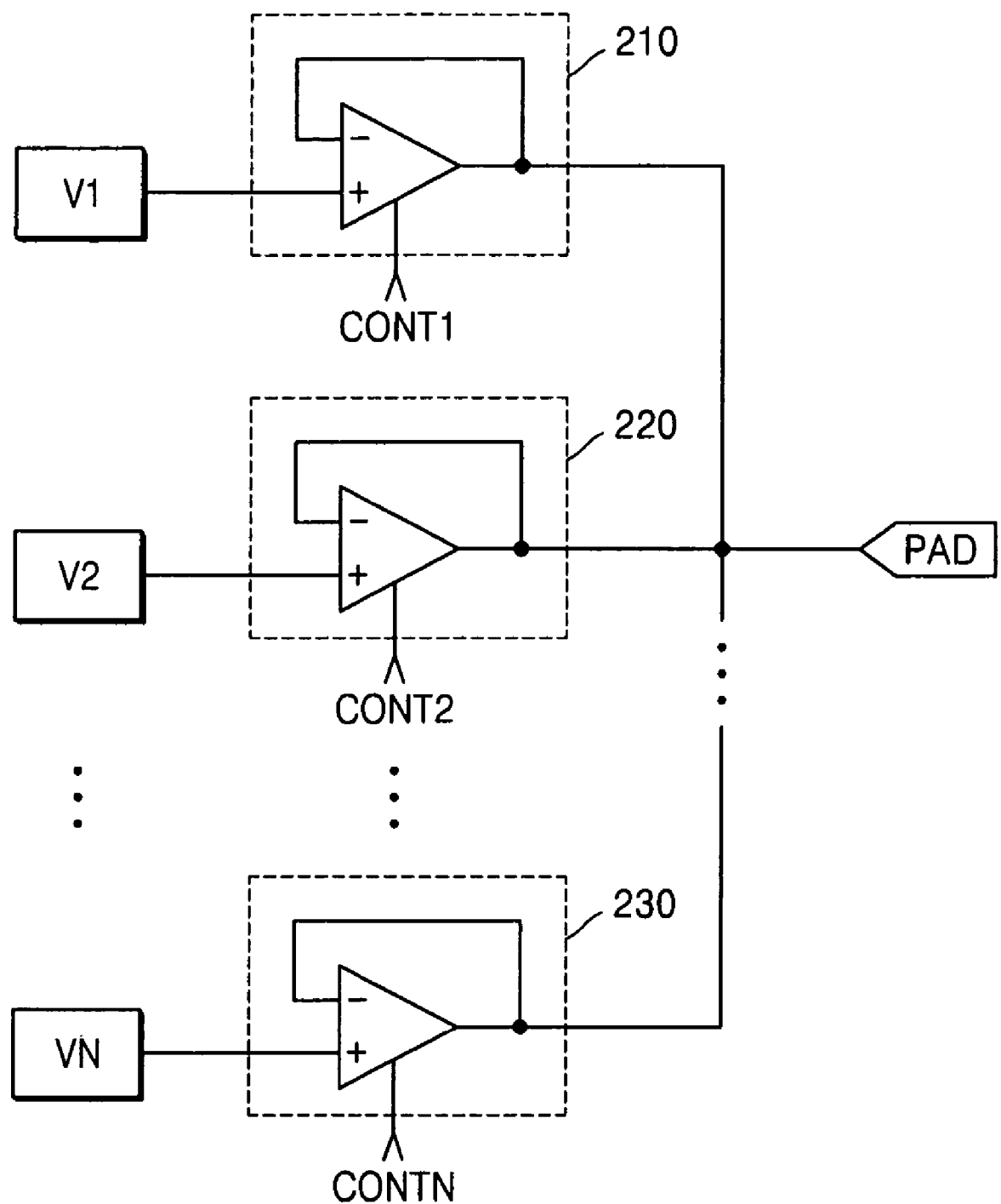
FIG. 2 is a schematic diagram of a semiconductor test circuit according to an embodiment of the present invention.

FIG. 2 is a schematic diagram of a semiconductor test circuit according to an embodiment of the present invention. Referring to FIG. 2, the semiconductor test circuit can measure the states of first, second, . . . , and Nth electrical signals V1, V2, . . . , and VN using a single pad PAD. The states of the first, second, . . . , and Nth electrical signals V1, V2, . . . , and VN are not measured simultaneously because a single pad PAD is used. Instead, electrical signals among the first, second, . . . , and Nth electrical signals V1, V2, . . . , and VN to be measured are selected and the states of the selected electrical signals are sequentially measured, one at a time.

When measuring a single electrical signal of the first through Nth electrical signals V1, V2, . . . VN, using a single pad, first, second, . . . , and Nth signal selection units, or selection blocks, 210, 220, . . . , and 230 are respectively interposed between the first, second, . . . , and Nth electrical signals V1, V2, . . . , and VN and the single, common, pad PAD, so that the states of the selected electrical signals to be measured are not affected by the states of the other connected first, second, . . . , and Nth electrical signals V1, V2, . . . , and VN.

The first electrical signal V1 is transmitted to the pad PAD via the first signal selecting block 210. Similarly, the second electrical signal V2 is transmitted to the pad PAD via the second signal selecting block 220, and the Nth electrical signal VN is transmitted to the pad PAD via the Nth signal selecting block 230.

If one of the first, second, . . . , and Nth signal selecting blocks 210, 220, . . . , and 230 is enabled, other blocks need to be disabled. First, second, . . . , and Nth control signals CONT1, CONT2, . . . , and CONTN are used to enable and disable the respective blocks. For example, if the first signal selecting block 210 is enabled by the first control signal CONT1, the remainder of the blocks are disabled.

In one embodiment, the first signal selecting block 210 can be configured using an operational amplifier that operates like a buffer. The first electrical signal V1 is input to a positive input terminal of the operational amplifier, and a negative input terminal of the operational amplifier is connected to an output terminal. A circuit having such an electrical connection structure is referred to as a voltage follower. The operational amplifier is controlled by the first control signal CONT1. Depending on the active or inactive state of the first control signal CONT1, the operational amplifier is either caused to operate normally, in which case the first electrical signal V1 is output or the operational amplifier is deactivated, and a high-impedance circuit relative to the PAD is created by the operational amplifier, by cutting off the transistors forming the amplifier.

The remaining second, . . . , and Nth signal selecting blocks 220, . . . , and 230 can also have the same configuration as the first signal selecting block 210 in which an operational amplifier has the structure of a buffer or a voltage follower.

Figure 3:
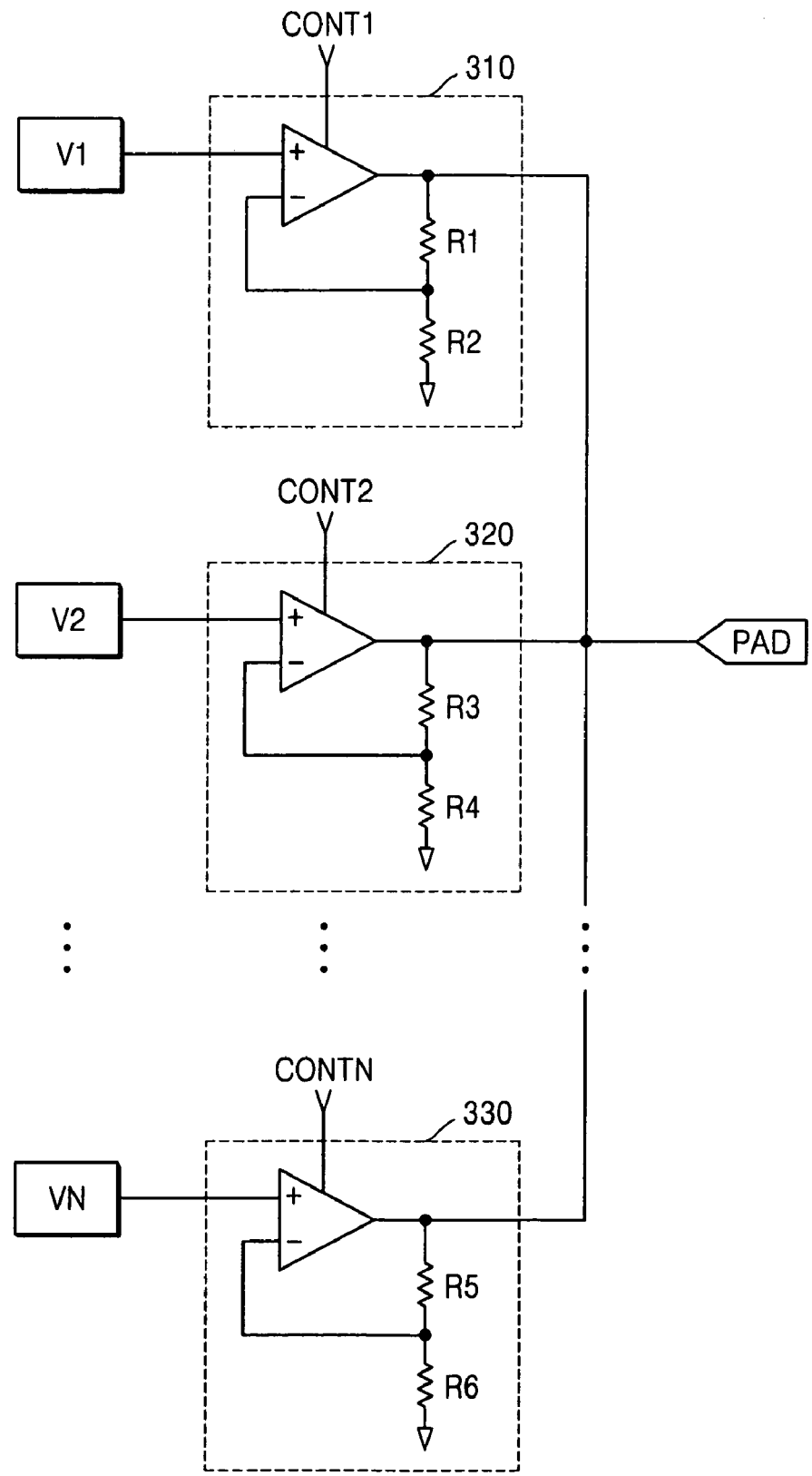
FIG. 3 is a schematic diagram of a semiconductor test circuit according to another embodiment of the present invention.

FIG. 3 is a schematic diagram of a semiconductor test circuit according to another embodiment of the present invention. Referring to FIG. 3, the components of the first, second, . . . , and Nth signal selecting blocks 310, 320, . . . , and 330 are different from the first, second, . . . , and Nth signal selecting blocks 210, 220, . . . , and 230 of the semiconductor test circuit of the embodiment illustrated in FIG. 2. In the present embodiment, outputs of the first, second, . . . , and Nth electrical signals V1, V2, . . . , and VN that are to be measured are controlled. In this case, each of the signal selecting blocks, for example, the first signal selecting block 310 is composed of an operational amplifier controlled by a first control signal CONT1, and two resistors R1 and R2. Two serially connected resistors R1 and R2 are interposed between an output terminal of the operational amplifier and a power voltage to obtain as an output a predetermined voltage value that is between an output voltage of the operational amplifier and the power voltage of a common node of the two resistors R1 and R2.

The first electrical signal V1 is input to a positive terminal of the operational amplifier, and the voltage of the common node of the two resistors R1 and R2 is input to a negative terminal of the operational amplifier. The buffer illustrated in FIG. 3 is similar to the buffer illustrated in FIG. 2. The difference between them is that the feedback voltage can be controlled in the buffer illustrated in FIG. 3.

The second, . . . , and Nth signal selecting blocks 320, . . . , and 330 can also be configured using the same approach as the first signal selecting block 310.

Although not illustrated in the drawings, it is possible to configure a semiconductor test circuit by combining the circuits illustrated in FIGS. 2 and 3. For example, a subset of the electrical signals VN can be connected to the common pad PAD using signal selecting blocks 230 of a type consistent with that of the first embodiment, and a subset of the electrical signals VN can be tested to the common pad PAD using signal selecting blocks 330 of a type consistent with that of the second embodiment.

Figure 4:
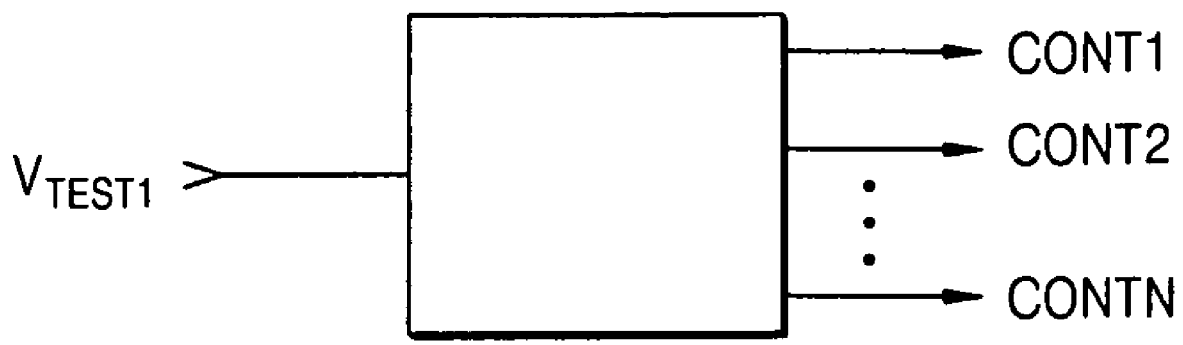
FIG. 4 is a block diagram of a control signal generating block which generates a plurality of control signals transmitted to the semiconductor test circuits illustrated in FIGS. 2 and 3, in accordance with the present invention.

FIG. 4 is a schematic diagram of a control signal generating block which generates the first, second, . . . , and Nth control signals CONT1, CONT2, . . . , and CONTN transmitted to the semiconductor test circuits illustrated in FIGS. 2 and 3. Referring to FIG. 4, the control signal generating block responds to a test enable signal VTEST1 input from a location on the semiconductor chip or, alternatively, from an external source. In response, the control signal generating block generates the first, second, . . . , and Nth control signals CONT1, CONT2, . . . , and CONTN. Although only the first, second, . . . , and Nth control signals CONT1, CONT2, . . . , and CONTN are illustrated in FIG. 4, it is possible to generate signals which are inverted signals of the first, second, . . . , and Nth control signals CONT1, CONT2, . . . , and CONTN.

As described above, the semiconductor test circuit of the present invention does not require a pull-up enable signal, and thus a delay time for testing is not required. In addition, multiple electrical signals present in the device to be measured during a testing procedure can be selected for measurement, even when the device is in a packaged state.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A semiconductor test circuit in a semiconductor device to measure a state of at least one electrical signal of the semiconductor device, the semiconductor test circuit comprising:

a first signal selecting unit comprising a first operational amplifier that either outputs a first electrical signal received from a first terminal in an active state or provides a high impedance state to a pad connected to a second terminal in an inactive state, in response to a first control signal;

a second signal selecting unit comprising a second operational amplifier that either outputs a second electrical signal received from a first terminal in an active state or provides a high impedance state to the pad connected to a second terminal in an inactive state, in response to a second control signal; and an Nth signal selecting unit comprising an Nth operational amplifier that either outputs an Nth electrical signal received from a first terminal in an active state or provides a high impedance state to the pad connected to the second terminal in an inactive state, in response to an Nth control signal, where N is an integer greater than two, wherein a voltage level of the first electrical signal at the first terminal of the first operational amplifier is isolated from a voltage at the pad, wherein a voltage level of the second electrical signal at the first terminal of the second operational amplifier is isolated from the voltage at the pad, and wherein a voltage level of the Nth electrical signal at the first terminal of the Nth operational amplifier is isolated from the voltage at the pad.

2. The semiconductor test circuit of claim 1, wherein, when one of the N control signals which control the N signal selecting units is enabled, a remainder of the N control signals are disabled.

3. The semiconductor test circuit of claim 2, further comprising a control signal generating unit that generates the N control signals in response to a test enable signal.

4. The semiconductor test circuit of claim 1, wherein the first signal selecting unit comprises the first operational amplifier in which the first electrical signal is input to a first input terminal and a second input terminal is connected to an output terminal, and either outputs the first electrical signal when activated or provides a high impedance state when not activated in response to the first control signal;

the second signal selecting unit comprises the second operational amplifier in which the second electrical signal is input to a first input terminal and a second input terminal is connected to an output terminal, and either outputs the second electrical signal when activated or outputs a high impedance state when not activated in response to the second control signal; and the Nth signal selecting unit comprises the Nth operational amplifier in which the Nth electrical signal is input to a first input terminal and a second input terminal is connected to an output terminal, and either outputs the Nth electrical signal when activated or outputs a high impedance state when not activated in response to the Nth control signal.

5. The semiconductor test circuit of claim 1, wherein the first signal selecting unit comprises:

a first resistor;

a second resistor in which a first terminal is connected to a first terminal of the first resistor and a second terminal is connected to a power voltage; and the first operational amplifier in which the first electrical signal is input to a first input terminal and a second input terminal is connected to a common terminal of the first and second resistors, and an output terminal of the first operational amplifier is connected to a second terminal of the first resistor and operates in response to the first control signal; the second signal selecting unit comprises:

a third resistor;

a fourth resistor in which a first terminal is connected to a first terminal of the third resistor and a second terminal is connected to a power voltage; and the second operational amplifier in which the second electrical signal is input to a first input terminal and a second input terminal is connected to a common terminal of the third and fourth resistors, and an output terminal of the second operational amplifier is connected to the second terminal of the third resistor and operates in response to the second control signal; and the Nth signal selecting unit comprises:

a fifth resistor;

a sixth resistor in which a first terminal is connected to a first terminal of the fifth resistor and a second terminal is connected to a power voltage; and the Nth operational amplifier in which the Nth electrical signal is input to a first input terminal and a second input terminal is connected to a common terminal of the fifth and sixth resistors, and an output terminal of the Nth operational amplifier is connected to the second terminal of the fifth resistor and operates in response to the Nth control signal.

6. The semiconductor test circuit of claim 1, wherein the N signal selecting unit comprises one of a first selection unit and a second selection unit, wherein the first selection unit includes a first Nth operational amplifier in which one of the N electrical signals is input to a first input terminal and a second input terminal is connected to an output terminal, and either outputs the electrical signal when activated or outputs a high impedance state when not activated in response to a corresponding control signal among the N control signals, and wherein the second selection unit comprises:

a first resistor;

a second resistor in which a first terminal is connected to a first terminal of the first resistor and a second terminal is connected to a power voltage; and a second Nth operational amplifier in which one of the N electrical signals is input to a first input terminal, a second input terminal is connected to a common terminal of the first and second resistors, and an output terminal is connected to the second terminal of the first resistor, and operates in response to a corresponding control signal among the N control signals.

7. The semiconductor test circuit of claim 1, wherein the first, second, and Nth electrical signals are one of DC voltages used in the semiconductor device.

8. The semiconductor test circuit of claim 1; wherein the semiconductor device is mounted in a package.

9. The semiconductor test circuit of claim 8, wherein the pad is bonded to a pin of the package.

* * * * *

UNITED STATES PATENT AND TRADEMARK OFFICE
CERTIFICATE OF CORRECTION

PATENT NO. : 7,221,170 B2  Page 1 of 1
APPLICATION NO. : 11/344845
DATED : May 22, 2007
INVENTOR(S) : Hong-jun Lee et al.

It is certified that error appears in the above-identified patent and that said Letters Patent is hereby corrected as shown below:

Title Page item 56

In the "U.S. Patent Documents" Section, delete "5,786,524 A 7/1998 Powell et al...568/862"

In the "Foreign Patent Documents" Section, delete "WO 2004/031108 A1 4/2004"

In the "Foreign Patent Documents" Section, delete "WO 94/22563 10/1994"

Column 8, line 25 delete ";" after claim 1 and insert --,--

Signed and Sealed this

Sixth Day of October, 2009

David J. Kappos
*Director of the United States Patent and Trademark Office*